(12) United States Patent
Thimmegowda et al.

(10) Patent No.: US 10,593,624 B2
(45) Date of Patent: Mar. 17, 2020

(54) THREE DIMENSIONAL STORAGE CELL ARRAY WITH HIGHLY DENSE AND SCALABLE WORD LINE DESIGN APPROACH

(71) Applicant: Intel Corporation, Santa Clara, CA (US)

(72) Inventors: Deepak Thimmegowda, Boise, ID (US); Aaron Yip, Santa Clara, CA (US); Mark Helm, Santa Cruz, CA (US); Yongna Li, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/045,369

(22) Filed: Jul. 25, 2018

(65) Prior Publication Data

US 2018/0331034 A1 Nov. 15, 2018

Related U.S. Application Data

(62) Division of application No. 15/085,151, filed on Mar. 30, 2016, now Pat. No. 10,043,751.

(51) Int. Cl.
*H01L 21/768* (2006.01)
*H01L 23/528* (2006.01)
(Continued)

(52) U.S. Cl.
CPC .... *H01L 23/5283* (2013.01); *H01L 21/76816* (2013.01); *H01L 23/5226* (2013.01);
(Continued)

(58) Field of Classification Search
CPC ......... H01L 29/42324; H01L 27/11517; H01L 27/1157; H01L 27/11582; H01L 27/11556; H01L 27/11524; H01L 27/115; H01L 27/0207; H01L 23/53209; H01L 21/76877; H01L 21/76841; H01L 21/28518; H01L 23/5283; H01L 23/5226; H01L 21/76816; H01L 21/76879
See application file for complete search history.

(56) References Cited

U.S. PATENT DOCUMENTS 8,111,549 B2 2/2012 Yip
9,202,536 B2 12/2015 Helm et al.
(Continued)

OTHER PUBLICATIONS

The Notification of Transmittal of the International Search Report and Written Opinion from counterpart PCT Application No. PCT/US2017/013044, dated Apr. 28, 2017, 12 pages.
(Continued)

*Primary Examiner* — Thanh T Nguyen
(74) *Attorney, Agent, or Firm* — Compass IP Law PC

(57) ABSTRACT

An apparatus is described. The apparatus includes a three dimensional storage cell array structure. The apparatus also includes a staircase structure having alternating conductive and dielectric layers, wherein respective word lines are formed in the conductive layers. The word lines are connected to respective storage cells within the three dimensional storage cell array structure. The apparatus also includes upper word lines above the staircase structure that are connected to first vias that connect to respective steps of the staircase structure. The upper word lines are also connected to second vias that run vertically off a side of the staircase structure other than a side opposite the three dimensional storage cell array structure. The second vias are connected to respective word line driver transistors that are disposed beneath the staircase structure.

6 Claims, 18 Drawing Sheets

(51) Int. Cl.
*H01L 49/02* (2006.01)
*H01L 23/522* (2006.01)
*H01L 27/11524* (2017.01)
*H01L 27/11578* (2017.01)

(52) U.S. Cl.
CPC ........ *H01L 28/00* (2013.01); *H01L 27/11524* (2013.01); *H01L 27/11578* (2013.01)

(56) References Cited

U.S. PATENT DOCUMENTS

| | | |
|---|---|---|
| 9,589,978 B1 * | 3/2017 | Yip |
| 2013/0016558 A1 * | 1/2013 | Ahn .................. G11C 16/0483 365/185.03 |
| 2014/0061747 A1 | 3/2014 | Tanzawa et al. |
| 2014/0241026 A1 | 8/2014 | Tanzawa |
| 2014/0361241 A1 | 12/2014 | Sasago et al. |
| 2014/0380108 A1 | 12/2014 | Goldman et al. |
| 2015/0001613 A1 | 1/2015 | Yip et al. |
| 2015/0228623 A1 | 8/2015 | Oh et al. |
| 2015/0228652 A1 | 8/2015 | Cheng |
| 2015/0340366 A1 | 11/2015 | Lim et al. |
| 2015/0371925 A1 | 12/2015 | Thimmegowda et al. |

OTHER PUBLICATIONS

Extended European Search Report for Patent Application No. 17776028.7, dated Oct. 28, 2019, 8 pages.

\* cited by examiner

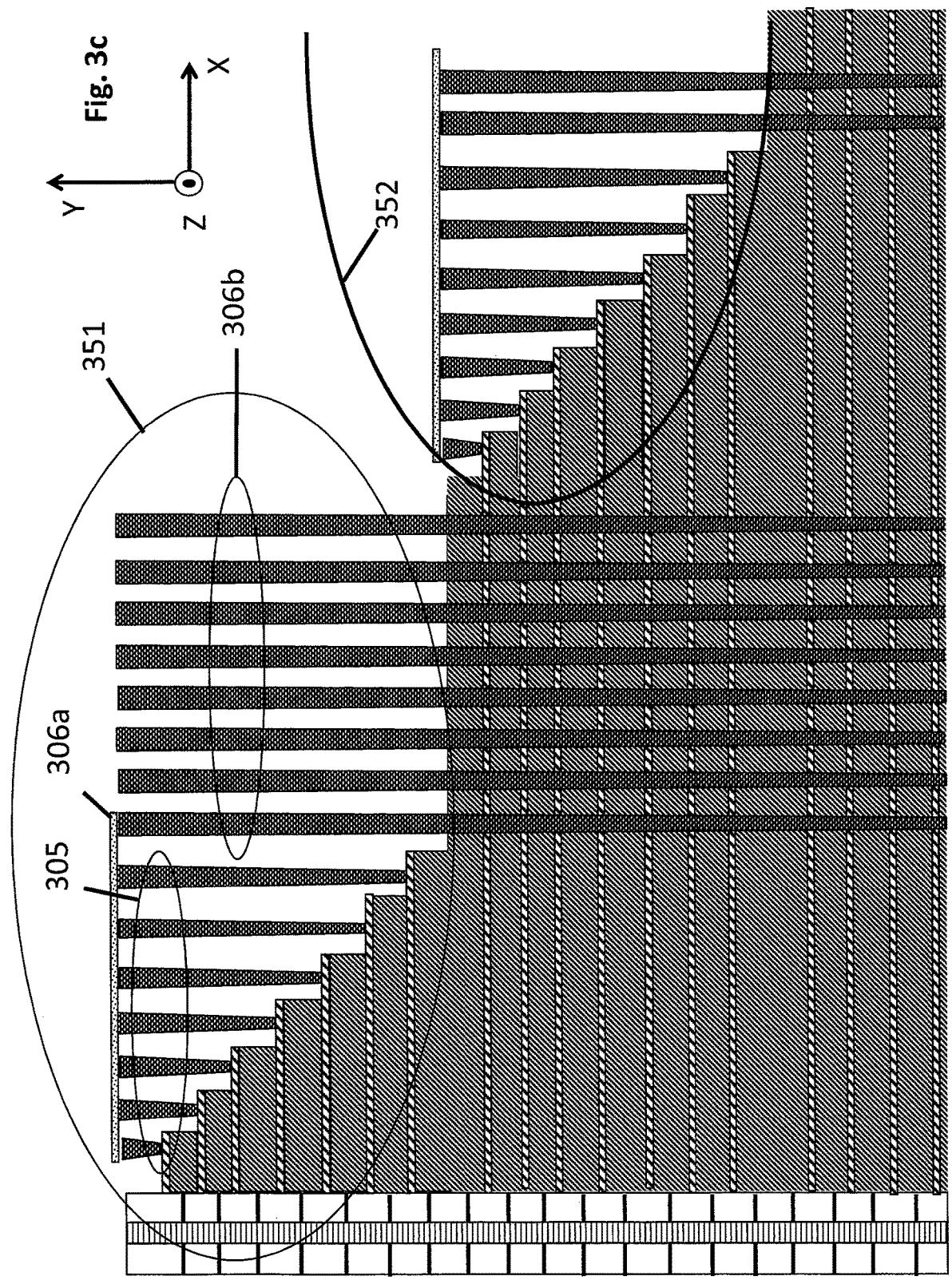

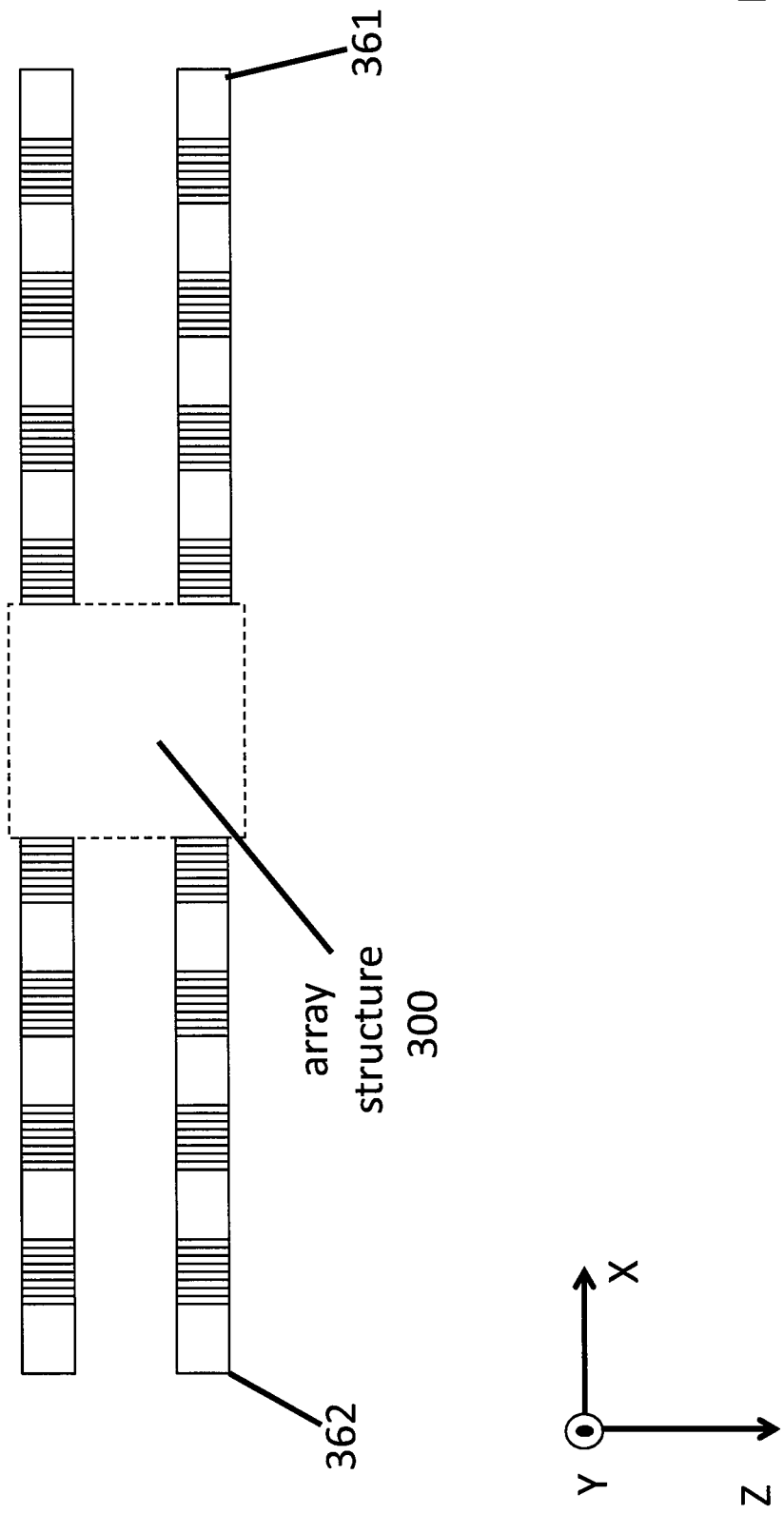

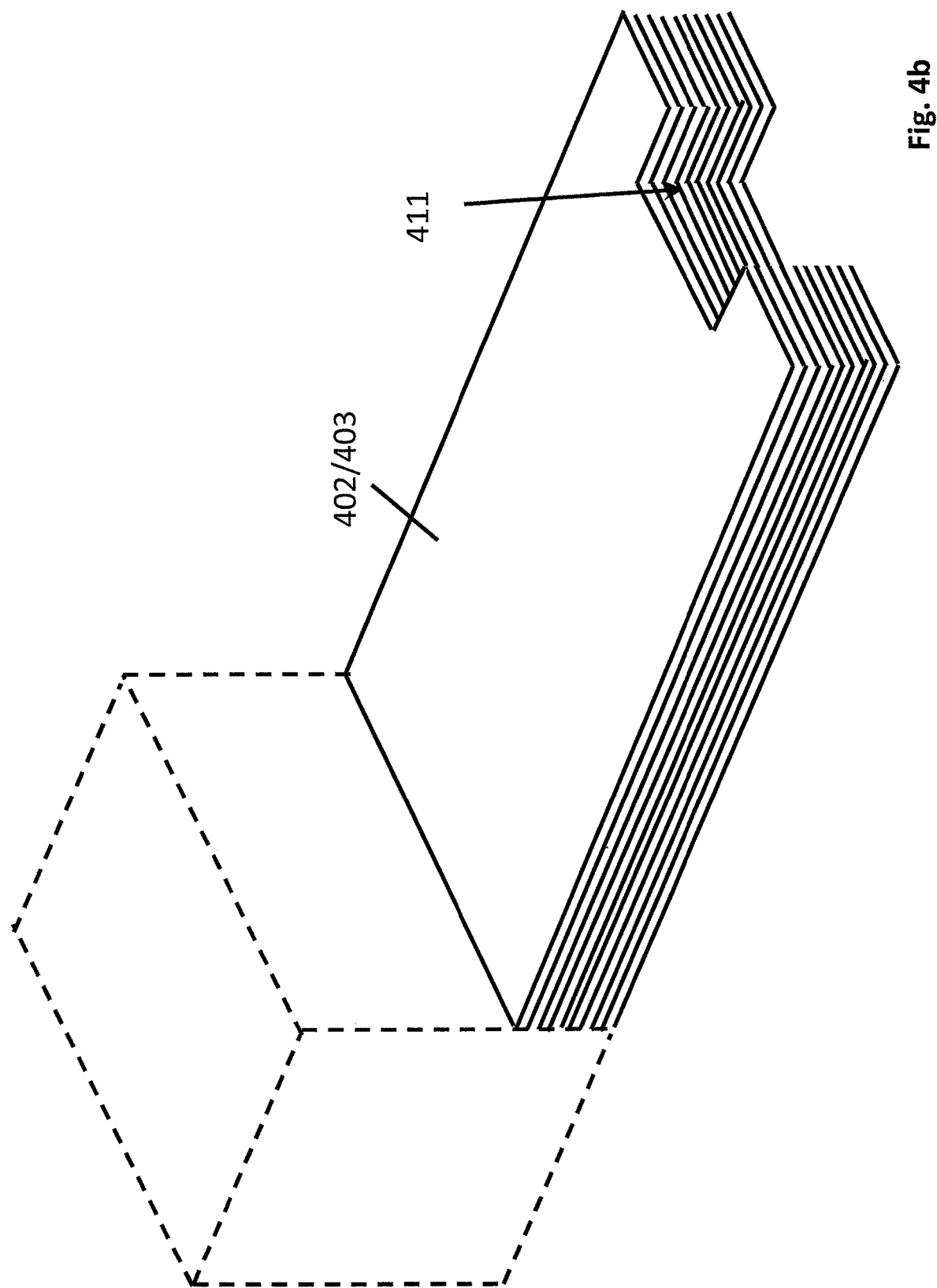

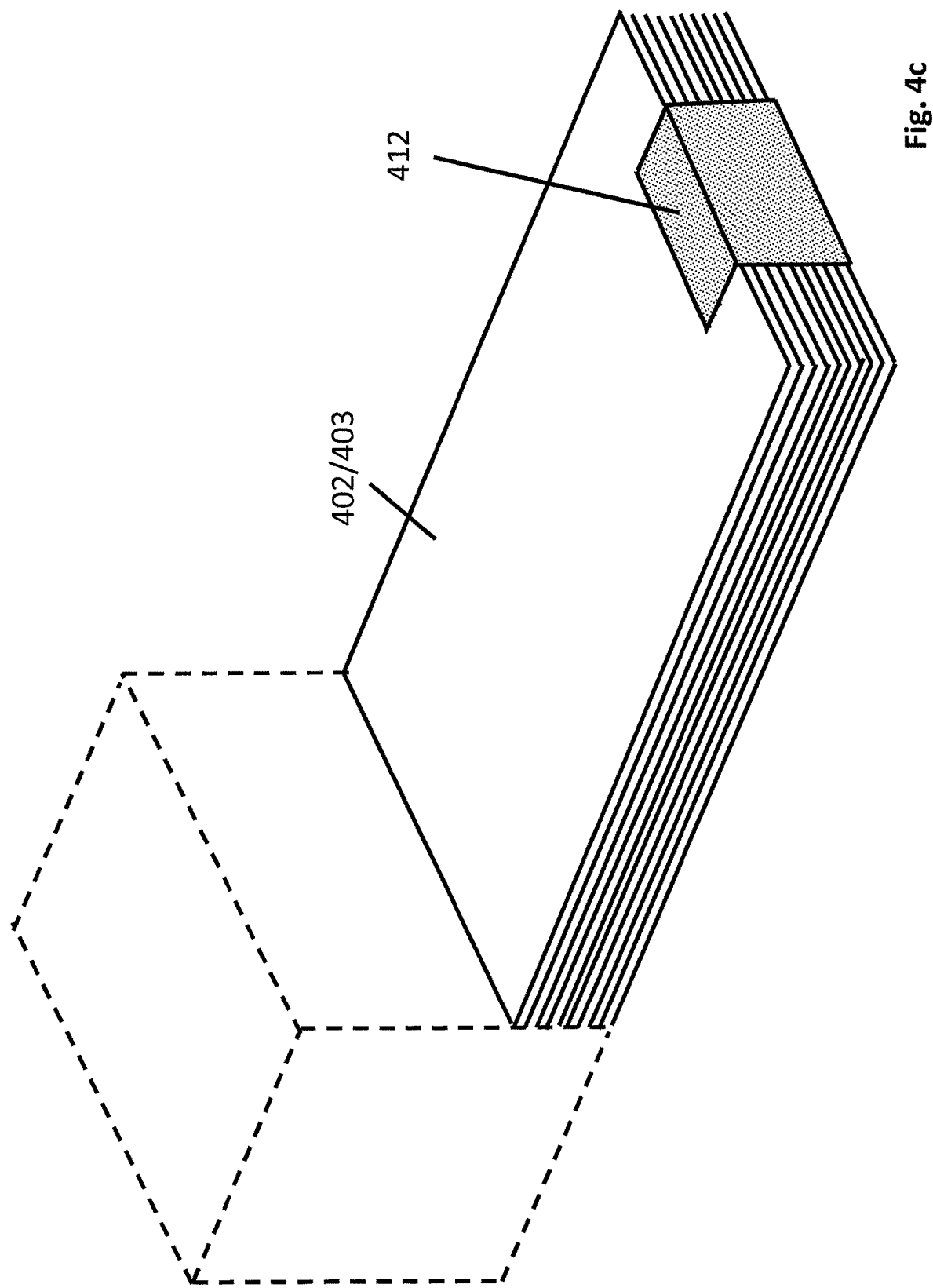

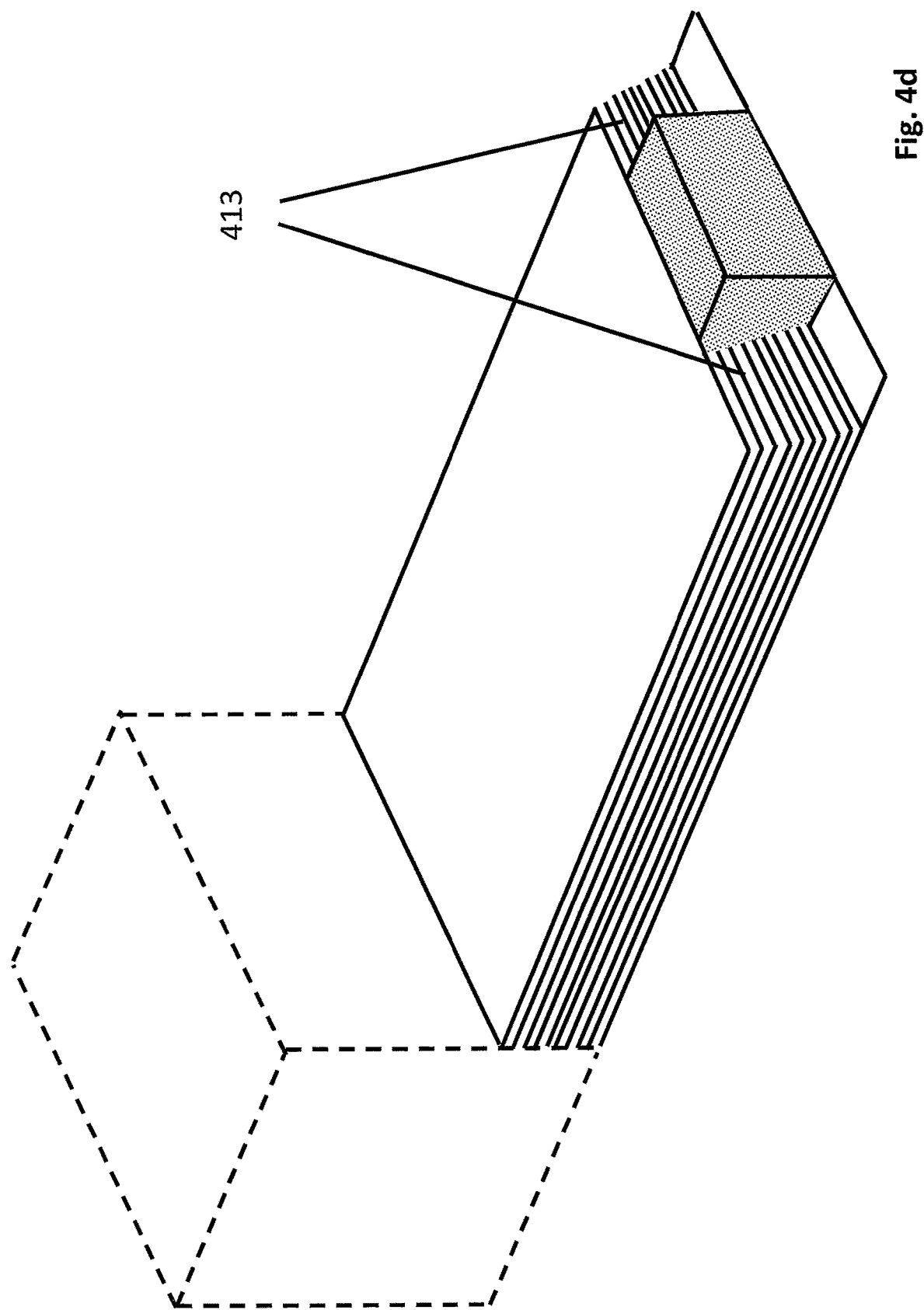

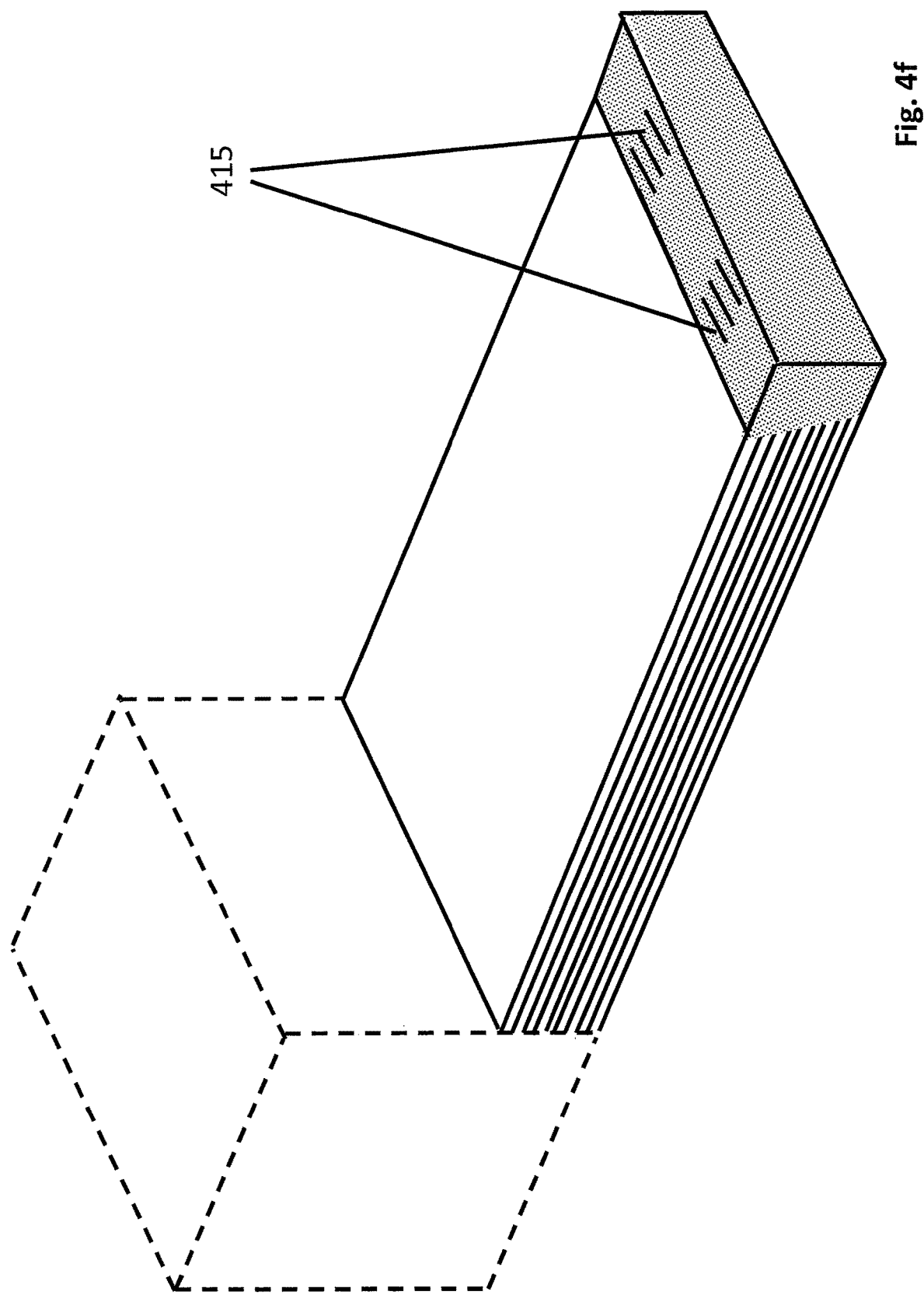

ion is a divisional of and claims the benefit
THREE DIMENSIONAL STORAGE CELL ARRAY WITH HIGHLY DENSE AND SCALABLE WORD LINE DESIGN APPROACH

RELATED CASES

This applicat of U.S. patent application Ser. No. 15/085,151, entitled, "THREE DIMENSIONAL STORAGE CELL ARRAY WITH HIGHLY DENSE AND SCALABLE WORD LINE DESIGN APPROACH", filed Mar. 30, 2016, which is incorporated by reference in its entirety.

FIELD OF INVENTION

The instant application is directed to the semiconductor manufacturing arts generally, and, more specifically to a three dimensional storage cell array with highly dense and scalable word line design approach.

BACKGROUND

The emergence of mobile devices has created keen interest amongst non volatile semiconductor memory manufacturers to increase the densities of their devices. Generally, mobile devices do not make use of disk drives, but instead favor use of semiconductor based non volatile storage devices. Historically, however, semiconductor storage devices do not have the same storage density as disk drives.

In order to bring the storage densities of semiconductor memories closer to or beyond disk drives, non volatile memory device manufacturers are developing three dimensional memory technologies. In the case of three dimensional memory technologies, individual storage cells are vertically stacked on top of another within the storage device. Three dimensional memory devices may therefore provide a mobile device with disk drive like storage density in a much smaller package, cost and power consumption envelope. However, the manufacture of three dimensional memory devices raises new manufacturing technology challenges.

FIGURES

A better understanding of the present invention can be obtained from the following detailed description in conjunction with the following drawings, in which:

FIG. 1 shows a transistor level design of a storage cell stack (prior art);

FIGS. 2*a* and 2*b* show prior art word line structures;

FIGS. 3*a* through 3*g* show embodiments of structures to support improved word line structures;

FIGS. 4*a* through 4*f* show a method of manufacturing the improved word line structures of FIGS. 3*a* and 3*b*.

DETAILED DESCRIPTION

Figure 1:
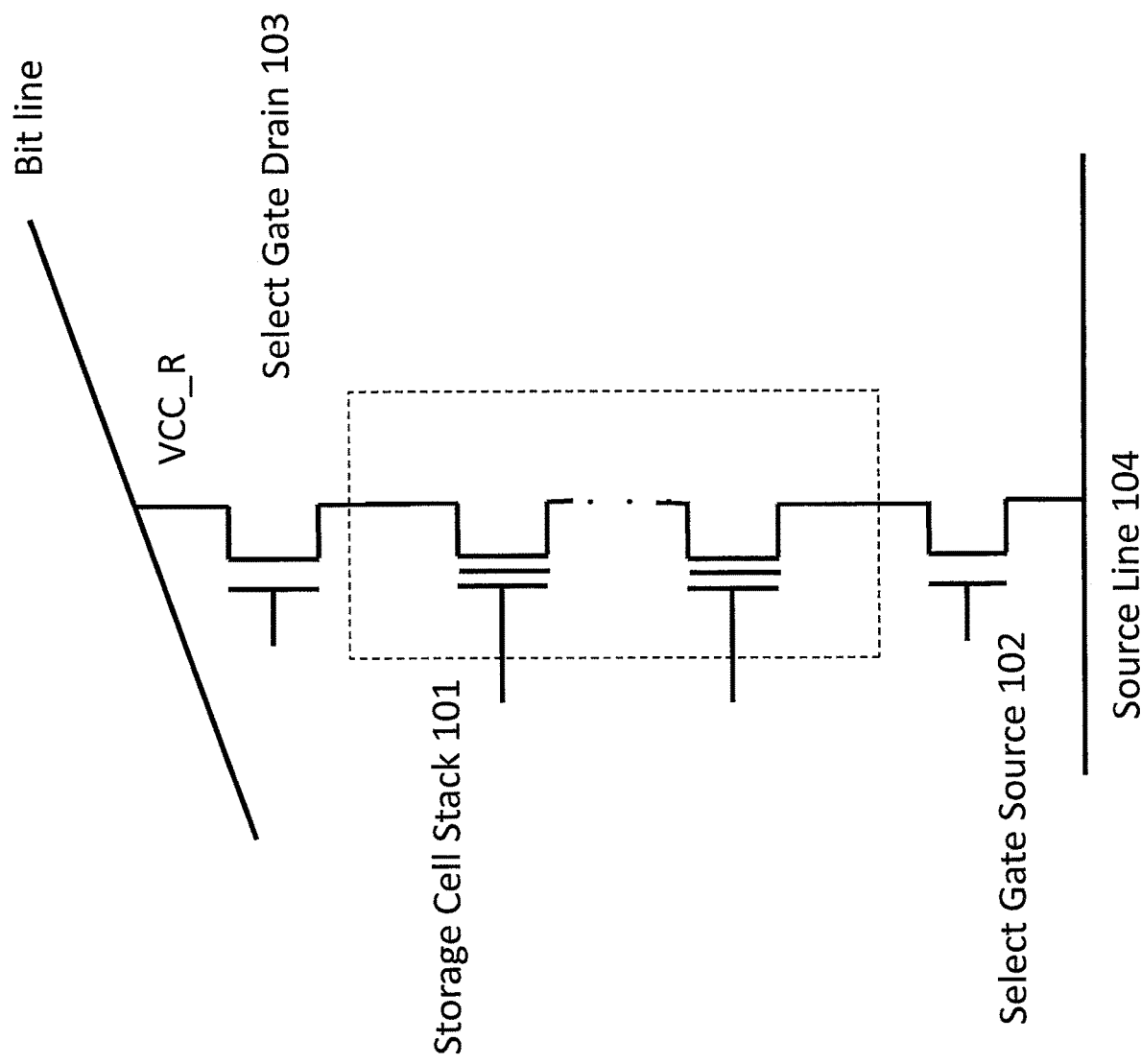

FIG. 1 shows a circuit schematic for the storage cell region of a three dimensional NAND FLASH memory. As observed in FIG. 1, the circuit includes a stack of NAND FLASH storage cells 101 coupled between a select gate source transistor 102 and a select gate drain transistor 103. The select gate source transistor 102 is coupled to a source line 104. The stack of storage cells 101 may be implemented as a three dimensional stack of FLASH transistors that are monolithically integrated as a three dimensional storage array on a semiconductor chip along with the select gate source and select gate drain transistors 102, 103 as well as other transistor devices (not shown) that help implement, e.g., the NAND function of the storage cell, sense amplifiers, row decoders, address decoders, etc.

Figure 2A:
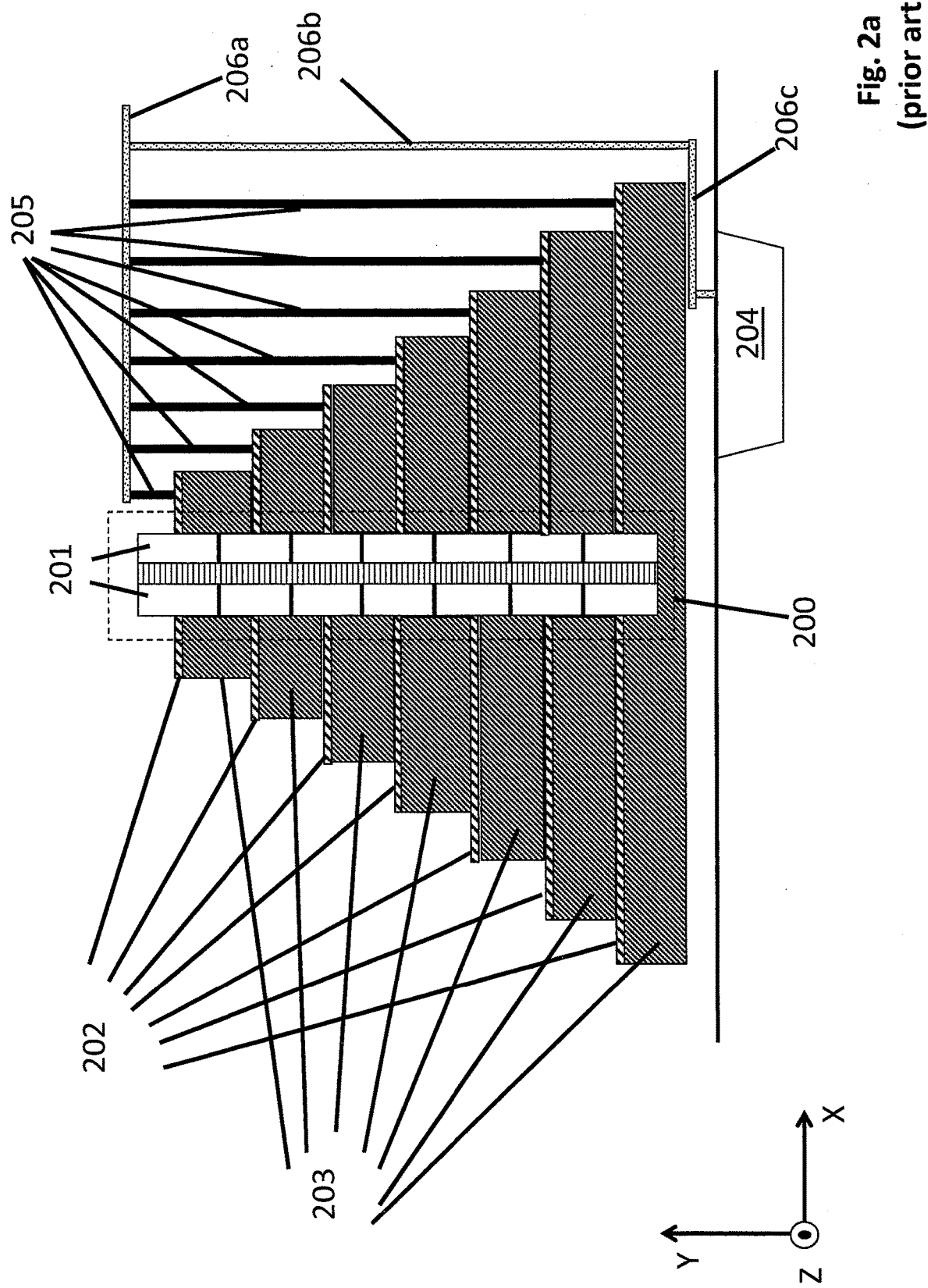

FIG. 2*a* shows a simplistic side view of a three-dimensional NAND structure. As can be seen in FIG. 2*a*, a multiple columns of individual storage cells 201 are packed into a single storage cell array structure 200. For simplicity only two columns of storage cells are shown along the x axis within the storage cell array 200. In typical embodiments, the storage cell array 200 includes more than two columns along a particular axis of the array structure (4, 8, 16, etc.). Additionally, again for ease of drawing, only seven storage cells are observed within a column of stacked storage cells. As observed in FIG. 2*a*, each storage cell is coupled to its own word line wiring layer 202. In order to connect each word line layer to both its corresponding storage cell and a corresponding word line transistor 204 that drives an appropriate word line signal on the word line wiring layer 202, a staircase structure is formed where each next vertically higher storage cell in the storage cell array corresponds to a next higher step in the staircase. Here, each step in the staircase is implemented with a word line wiring conductive layer 202 (e.g., composed of metal or doped poly-silicon) that is disposed on a lower layer of dielectric material 203.

Connection of a particular one of the word line wiring layers 202 to its particular word line driving transistor is accomplished with a series connection of a first word line via 205, and upper word line wire 206*a*, and a second word line via 206*b*. The second word line via 206*b* ultimately makes contact to a word line driving transistor 204 that resides beneath the staircase structure through a wire 206*c* that is connected to the second word line via 206*b* and runs beneath the staircase structure.

It is important to point out that the cross section of FIG. 2*a* only shows one driving transistor 204, and one set of upper word line wiring 206*a*, second word line via 206*b* and underside wiring 206*c* that is in contact with only one of the first word line vias 205. That is, in the particular embodiment of FIG. 2*a*, there are six more upper word line wires, second vias, underside wires and driving transistors have not been drawn in FIG. 2*a* for illustrative convenience. In various embodiments, the other wires may be located, e.g., in one or more additional layers beneath the structure (e.g., beneath wire 206*c*) and/or, e.g., one or more additional layers above the structure (e.g., above wire 206*a*).

Figure 2B:
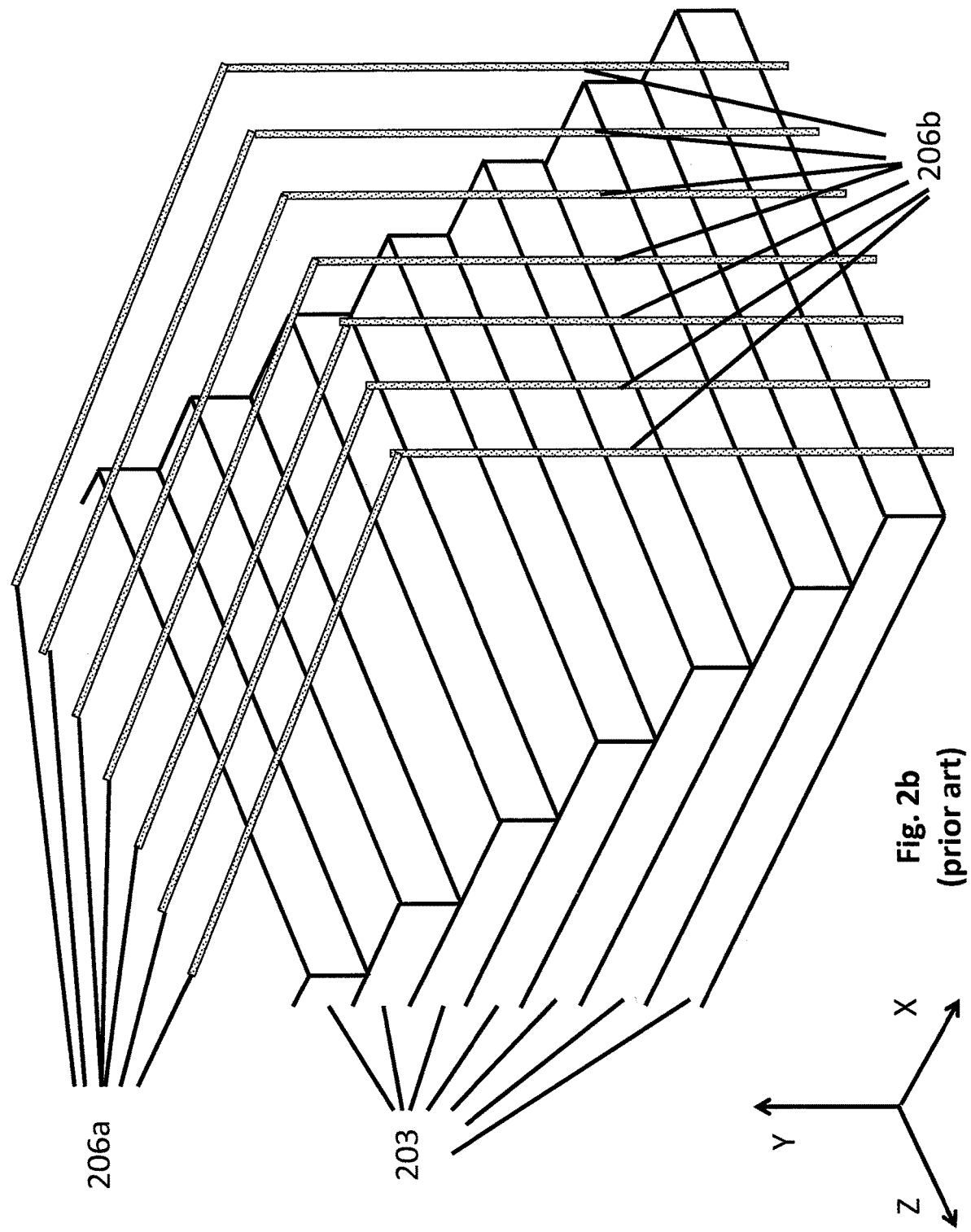

FIG. 2*b* shows a portion of the structure of FIG. 2*a* from an angled view perspective. Here, the seven second vias 206*b* as they are placed along the z axis are clearly visible. Each of the seven second vias 206*b* connect to their own respective upper wire line wire 206*a* that are displaced from one another along the z axis in a manner that aligns each of them with their respective second via 206*b*.

Here, referring to FIGS. 2*a* and 2*b*, each of the upper word lines 206*a* are connected to a different one of the first vias 205 (not shown in FIG. 2*b*) so that each of the second vias 206*b* are connected to a different step of the staircase (i.e., each of the second vias 206*b* is connected to a different one of the word line layers 202 of FIG. 2*a*). Likewise, each of the second vias 206*b* is connected to a different driving transistor beneath the stair case structure. Here, each driving transistor is located approximately beneath the particular one of the upper word lines 206a that it physically drives a signal on.

As can be appreciated, with each new generation of manufacturing technology, smaller and smaller storage cells can be manufactured. In order to "pack" as many storage cells into a same array structure 200, a single column 201 of storage cells may contain more and more cells with each new manufacturing technology generation, and/or, more and more columns may be present within a same array structure 200. Regardless, packing more storage cells into a same array structure requires the presence of more word lines to connect to each of the storage cells individually.

A problem is that word line wiring minimum features do not scale down as rapidly as storage cell size with each new manufacturing technology. As such, although each new manufacturing technology may, e.g., pack more storage cells into a same sized or even smaller sized array structure, as observed in FIG. 2b, the number of word lines will continue to expand laterally along the z axis, eventually, way beyond the dimensions of the array structure along the z axis. Thus, the density of the memory chip itself will ultimately be limited by the ability to place word line wires next to one another along the z axis rather than the shrinking size of the storage cells.

Figure 3A:
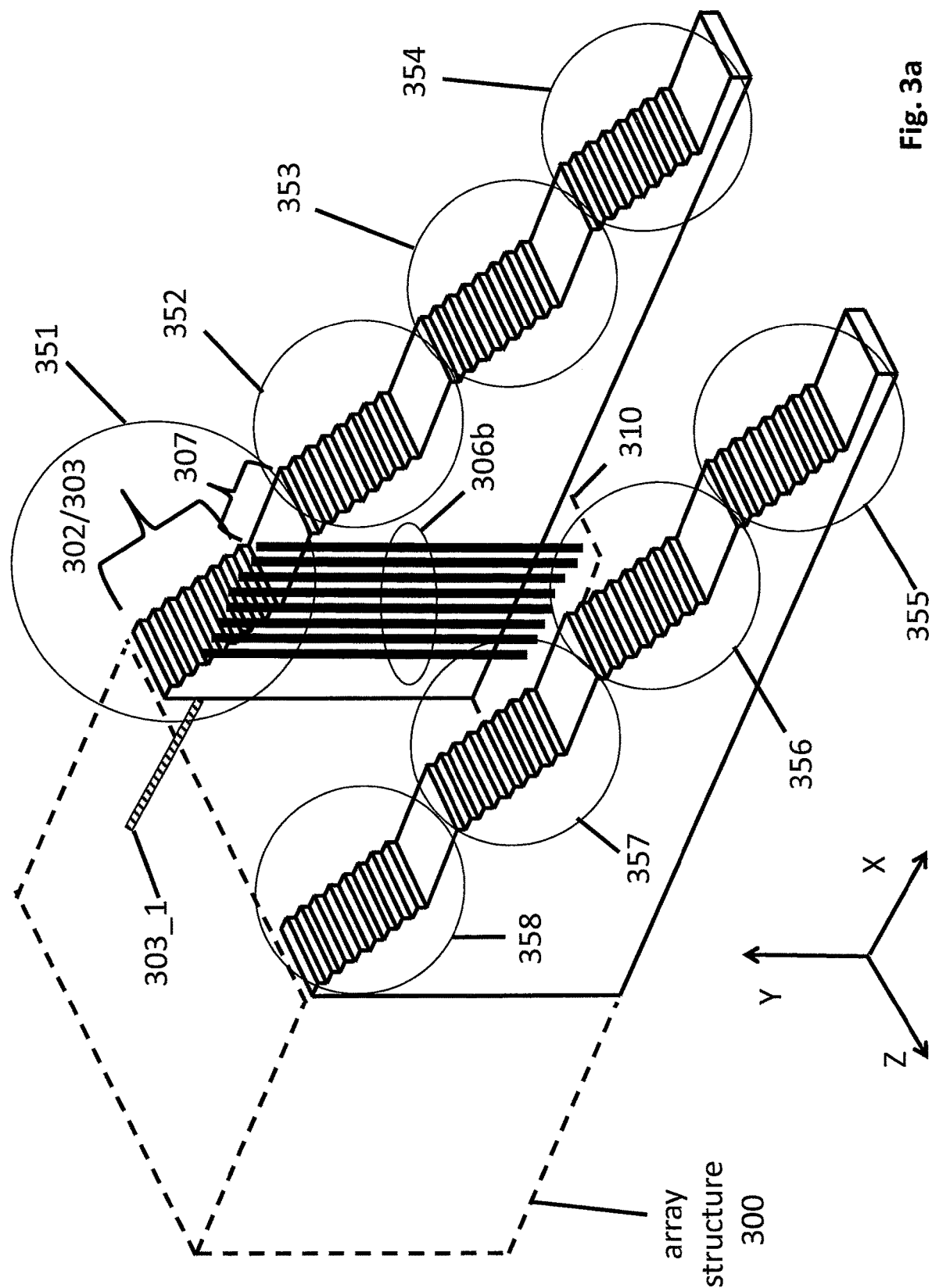

FIG. 3a shows a perspective of a new design in which the word lines that are coupled to the storage cells of a storage cell array 300 are distributed outward along the X axis rather than laterally along the Y axis. By so doing, minimum feature size may be defined more by the ability to form neighboring steps in the staircase structure than the lithography associated with lateral wiring placement. With the former being smaller than the latter, a smaller overall storage cell array and supporting word line wiring structures can be realized.

FIG. 3a shows a word line staircase design capable of supporting at least 64 different word lines that extend into the storage cell array 300. Here, a plurality of distinct staircases are observed 351 through 358 where each distinct staircase has eight steps and is therefore capable of supporting at least eight word lines that extend into the array structure 300. As with the approach of FIG. 2a, each stair of a staircase is composed of a word line conductive layer disposed over a dielectric layer. For drawing ease, FIG. 3a shows only one actual word line wire 303_1 extending into the storage cell array 300 (which extends from a step in staircase 351).

Referring to staircase structure 351, note that the staircase structure 351 includes both a staircase 302/303 (composed of alternating conductive and dielectric layers) and a landing 307. The landing 307 creates additional space for the second vias 306b that connect to respective word line driving transistors that reside within a surface area 310 of the semiconductor substrate beneath the overall staircase structure. For simplicity, FIG. 3a does not show any of the first vias that connect a particular staircase step to an upper word line wire, or the upper word line wires that connect the first vias to the second vias 306b.

Figure 3B:
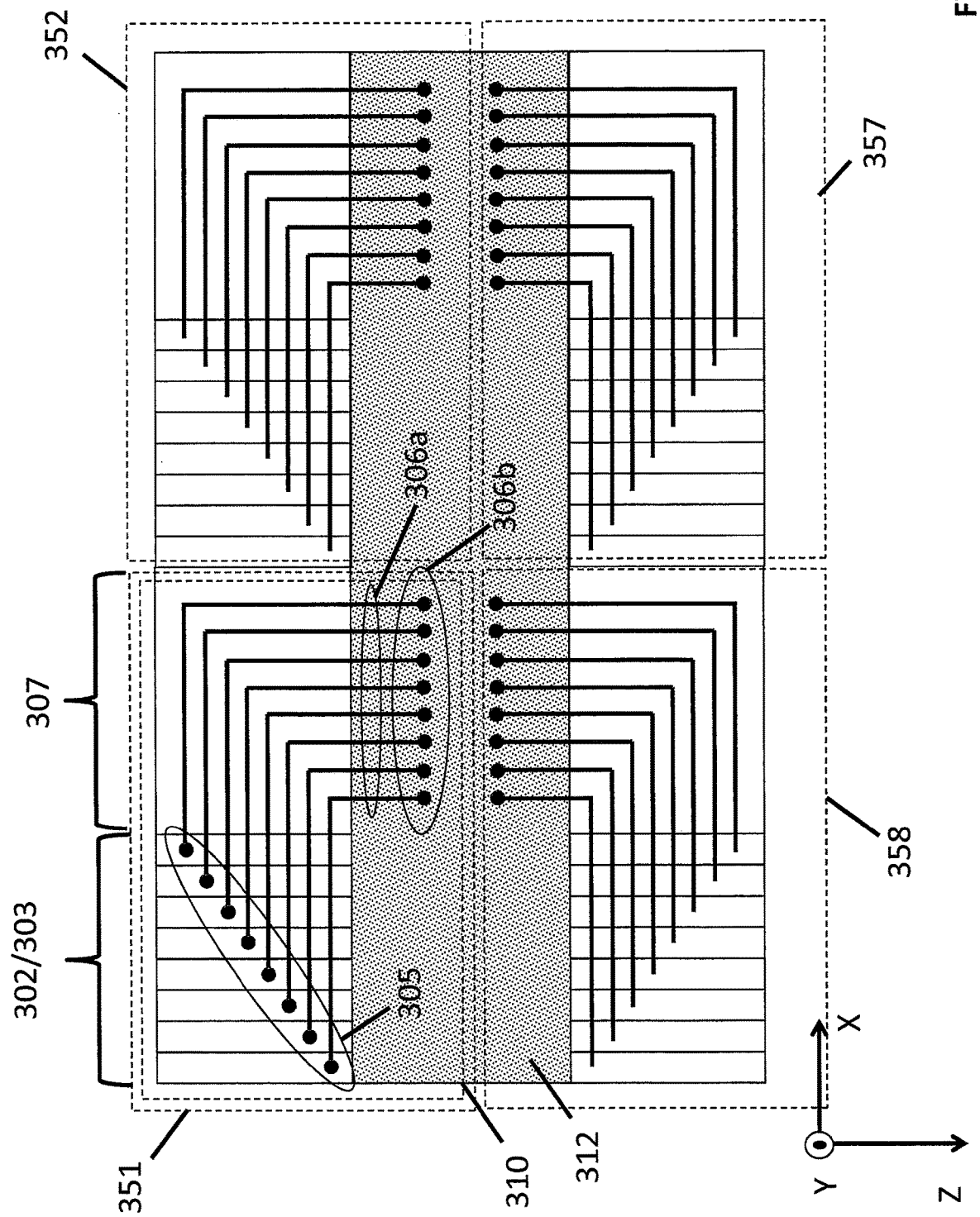

FIG. 3b shows a top down view of staircase structure 351 (upper left hand corner), staircase structure 352 (upper right hand corner), staircase structure 357 (lower right hand corner) and staircase structure 358 (lower left hand corner). FIG. 3c shows a cross section of staircases 351 and 352. FIG. 3b shows the relationship between the upper word line wires 306a, the first vias 305, and the second vias 306b. Referring to staircase 351 in particular, note that each of the upper word lines 306a connect a different one of the second vias 306b to a different step of the staircase 302/303. Referring to FIGS. 3a and 3b, note that landing 307 makes room for the second vias 306b and the driving transistors that are connected to them within surface area 310 of the semiconductor substrate that resides beneath the entire structure.

In the particular embodiment of FIGS. 3a and 3b, the second vias 306b are drawn as being "off to the side" of the landing area surface 307. In various other embodiments, the second vias may be located within the staircase landing 307 instead of or in combination with second vias that are located off to the side of the landing 307. Likewise, second vias may also run alongside the staircase 302/303. Also FIG. 3b shows a unit cell type design where second vias that are off to the side of a particular landing are run to the steps above that landing. For example, as drawn in FIG. 3b, second vias 306b run to the staircase structure of 302/303 of staircase 351. In alternate embodiments, other designs may be used (unit cell based or otherwise) where the second vias that are near a particular staircase or landing may be coupled to word line layers of some other staircase or landing. For instance, in an alternate embodiment, second vias that are roughly in the location of second vias 306b observed in FIGS. 3a and 3b may run to word lines associated with other staircase structures observed in FIG. 3a or 3b (e.g., any of staircases 352, 353, 354, 357 and/or 358 in FIG. 3a).

Figure 3D:
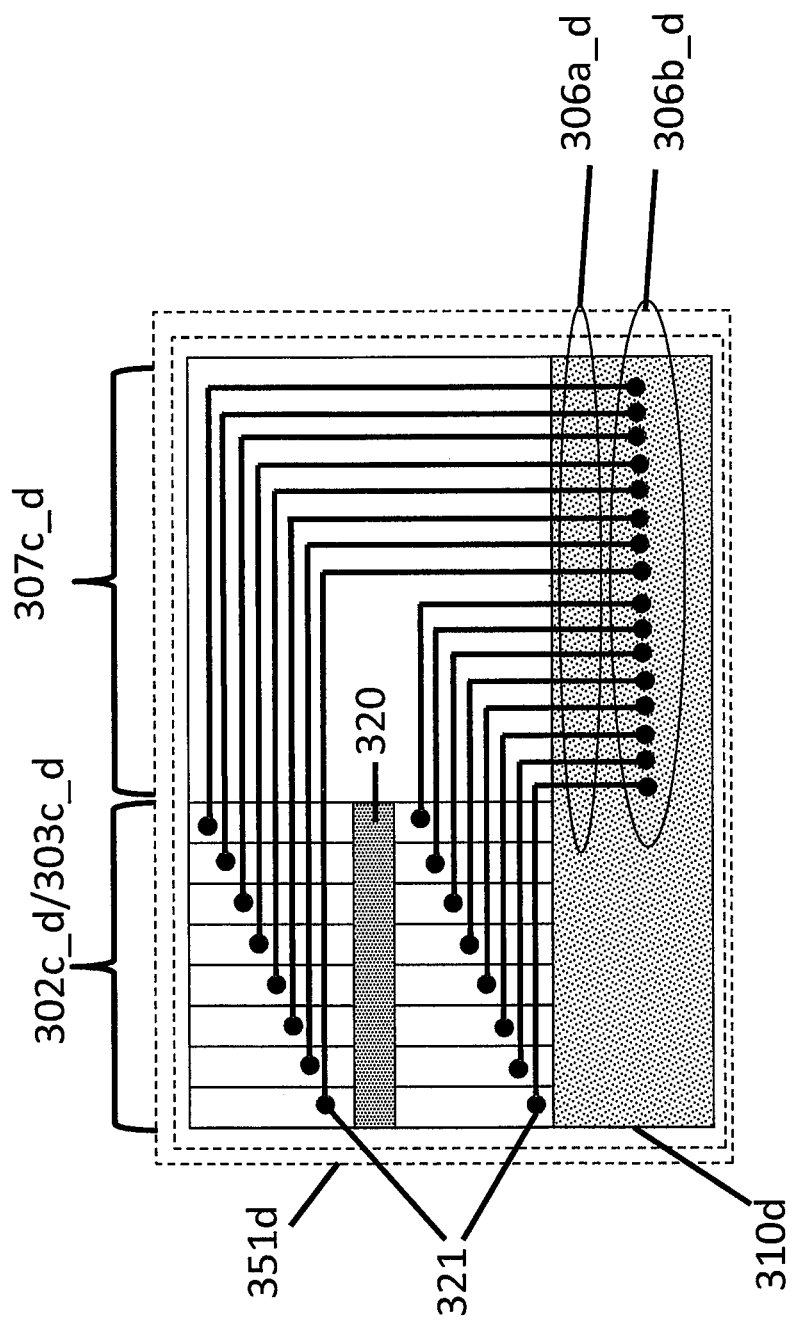

Note that the word line density per staircase structure can be extended beyond on word line per staircase step. For instance, the word line wiring density can be expanded from 8 word lines per staircase (as originally depicted in FIGS. 3b) to 16 word lines per staircase (as shown in FIG. 3d) by forming a block of insulation 320 that runs length-wise through the steps of the staircase along the x axis and is placed, e.g., approximately in the middle of the steps along the z axis. Feature 320 of FIG. 3d outlines where such an isolation block may be placed in the lower right hand corner staircase 357. Note that the isolation block will also extend downward in the −y direction through the depth of the staircase. If such an isolation block were formed in or between the staircases, each step of a staircase could support two word lines rather than one word line.

Figure 3E:
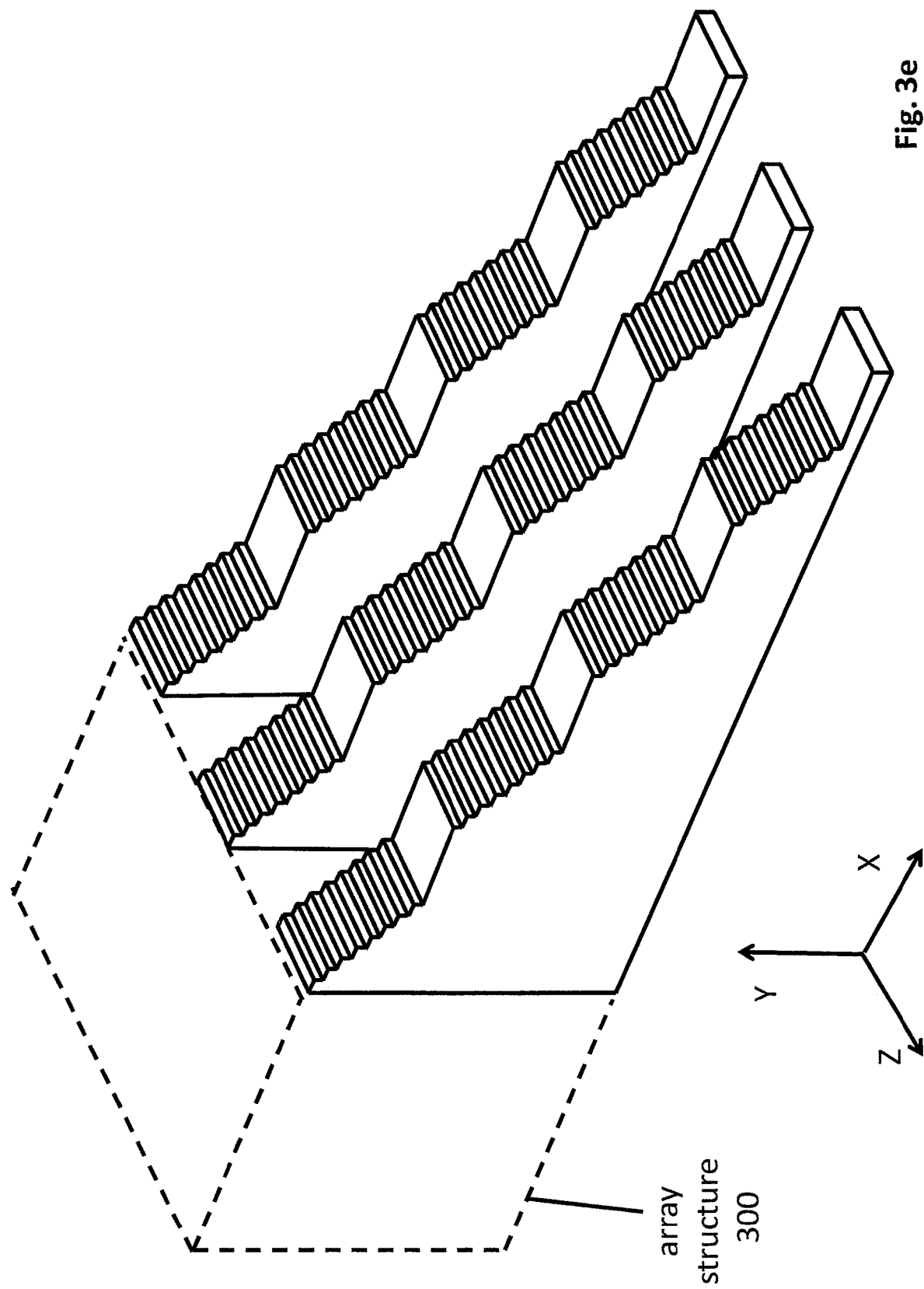

Here, as observed in FIG. 3d, pairs of first vias, such as first via pair 321, are disposed on either side of the isolation block 320 on a same step of the staircase 302c_d/303c_d and each of the first vias of the pair 321 are connected to their own respective one of upper word line wires 306a_d and second via 306b_d. Thus, the staircase design discussed herein is scalable to support even higher densities of word lines. Referring to FIGS. 3e and 3f, word line wiring densities could be extended further still by introducing more staircase chains per storage array structure 300. For example, FIG. 3e shows three staircase chains that are placed at the outer edges of the storage cell array along the z axis (whereas FIG. 3a only shows two such staircase chains).

Figure 3G:
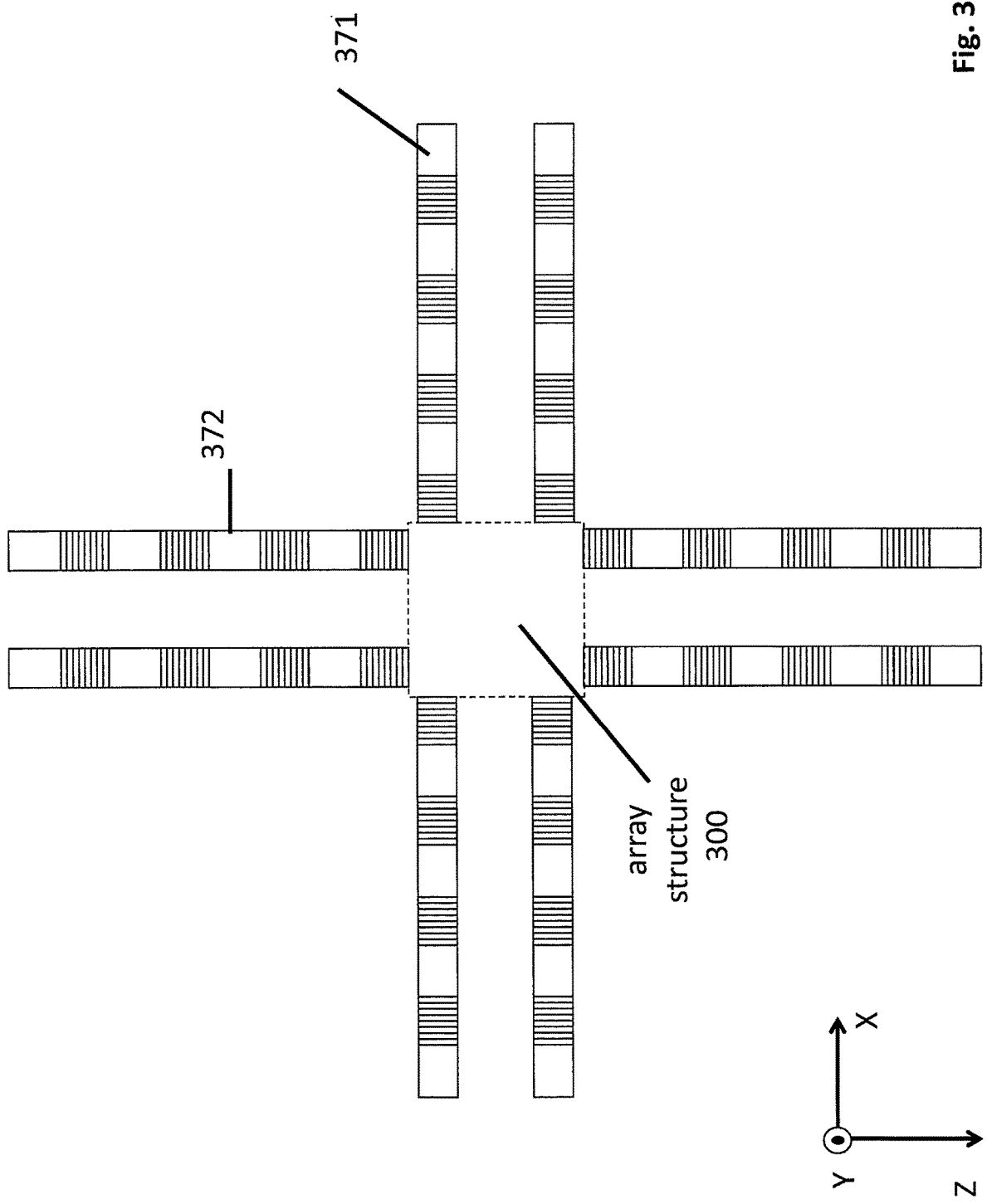

Furthermore, as observed in FIG. 3f, staircase chains may be formed on more than one face of the array structure. Here, different staircase chains that stem from different faces of the array structure 300 can service different word line layers. For example, in the embodiment of FIG. 3f, a staircase chain 361 on one face of the array structure 300 can service word line layers 0/2/4, etc., while, e.g., another staircase chain 362 on the opposite face of the array structure 300 can service word line layers 1/3/5, etc. FIG. 3g shows a 'four-sided' staircase in which a staircase chains stem from each of the four faces of the array structure 300. In the embodiment of FIG. 3g a first staircase 371 off one array structure face may service word lines 0, 4, 8, etc., while, a staircase 372 that stems from another side of the array structure can service word lines 1, 5, 9, etc. and so on. The grouping of word line layers serviced by the four faces does not need to be balanced (e.g., some staircases can service more word lines than others). The grouping can follow any order.

Thus, the distributed word line design of FIGS. 3a through 3g are highly scalable and are capable of supporting storage cell arrays 300 having extremely high densities of storage cells and corresponding word lines.

FIGS. 4a through 4f show a method of manufacturing a pair of staircase structures as discussed above. As observed in FIG. 4a, alternating layers of word line conductive material 402 and supporting dielectric 403 are formed. In an embodiment, each word line conductive layer is pattern to form actual word line wires that extend into the array structure 400 before a next higher dielectric is formed over the wiring layer. As such, stack 402/403 may essentially be a three dimensional stack of word lines that extend into the array structure 400.

Figure 4A:
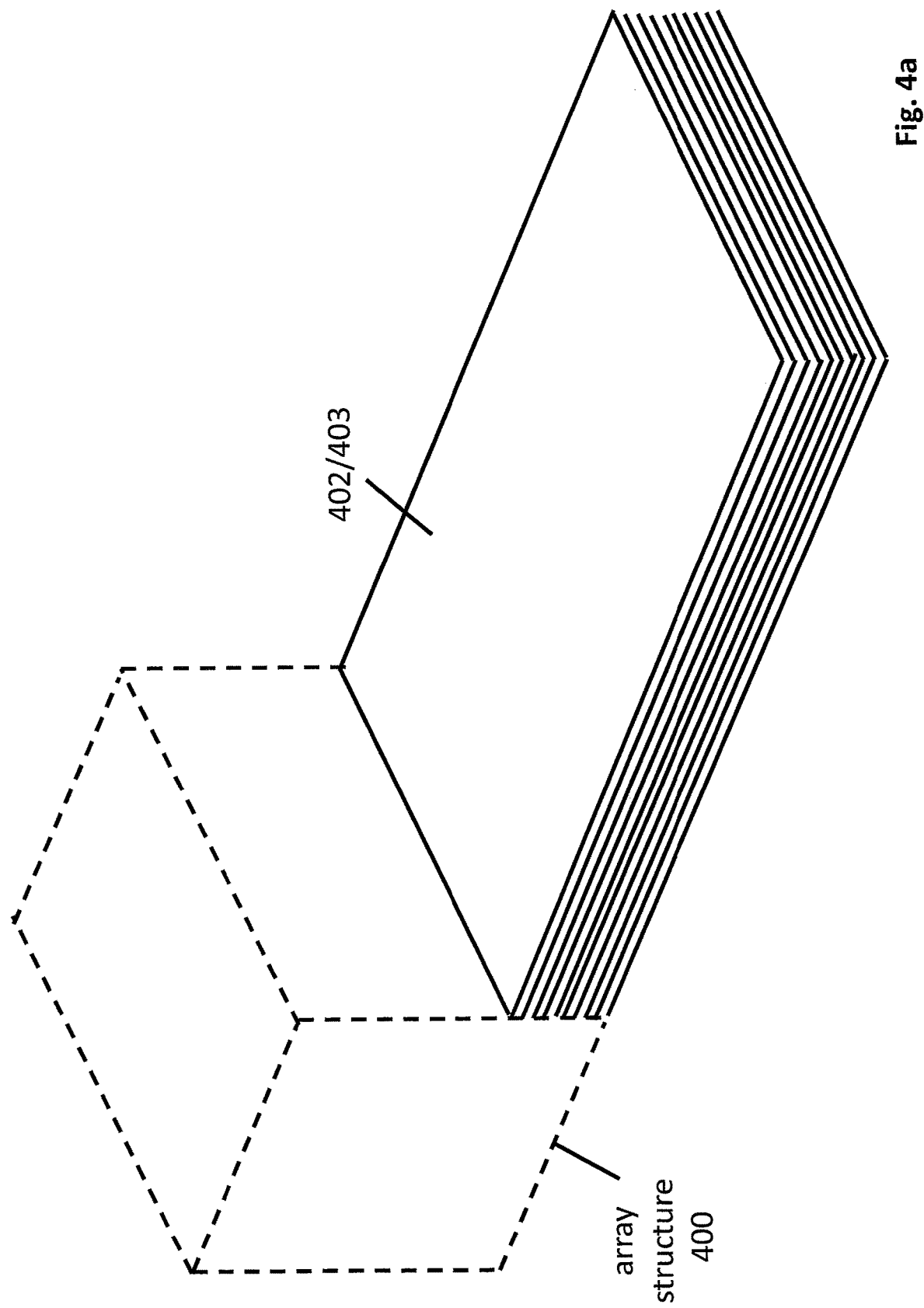
Figure 4E:
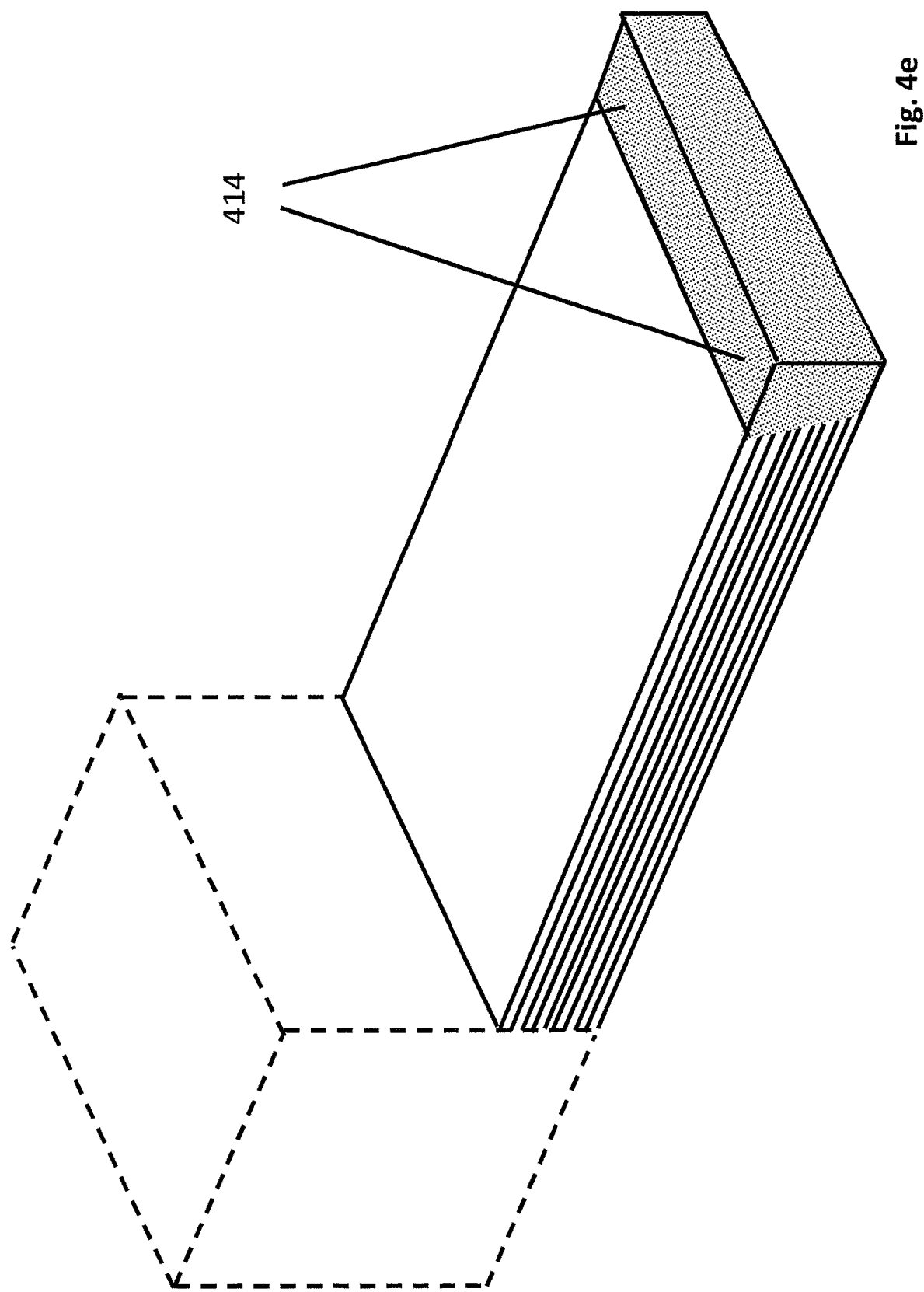

As observed in FIG. 4b, a region of the stack 403/403 is etched to form a void 411 within the stack 402/403. As observed in FIG. 4c, the void is subsequently filled with dielectric material 412. Then, as observed in FIG. 4d, a pair of staircase structures 413 are formed on either side of the dielectric material 412. The staircase structure may be formed by known techniques such as masking out all layers above and below next step to be formed so as to expose a region where a next step is to be formed and then etching the exposed region to form the step. After the step is formed the void that was created is filled with dielectric. The process repeats until all steps are formed. FIG. 4e shows the finished structure having a completed staircase surrounded by dielectric 414.

As observed in FIG. 4e, the dielectric is then patterned to form the first and second vias and the upper word lines 415. FIG. 4f shows the first and second vias and the upper word lines simplistically. In various embodiments the processing of dielectric 414 forms, e.g., the first and second vias 306b and upper word lines 306a discussed at length above with respect to FIG. 3b. That is, the dielectric 414 is etched a modest distance above the steps to form open voids to each of the steps and the open voids are filled with metal to form the first vias. The dielectric 414 is then etched a longer distance off to the side of the steps to form significantly deeper openings that run the height of the stack toward the substrate surface. These voids are then filled with metal to form the second vias. Then wiring is formed over the dielectric 414 to form upper word lines that connect respective pairs of first and second vias.

Note that the process of FIGS. 4a through 4f only forms staircase pairs 354 and 355 of FIG. 3a. In various embodiments the processes of FIGS. 4a through 4f are then repeated closer to the array structure 400 in a manner that masks out the previously created staircase structures 354, 355 as well as regions where the staircase structures to be formed in future recursions 351, 352, 357 and 358 so that only regions where the staircase structures to be formed in the instant recursion 353, 356 are exposed. Thus, after the second recursion of the processes of FIGS. 4a through 4f are performed staircase structures 353 and 356 have just been completed (with staircase structures 354 and 355 having been completed in the prior recursion). The processes of FIGS. 4a through 4f are then repeated for two more recursions to next form staircase structures 352 and 357 and then staircase structures 351 and 358.

Figure 5:
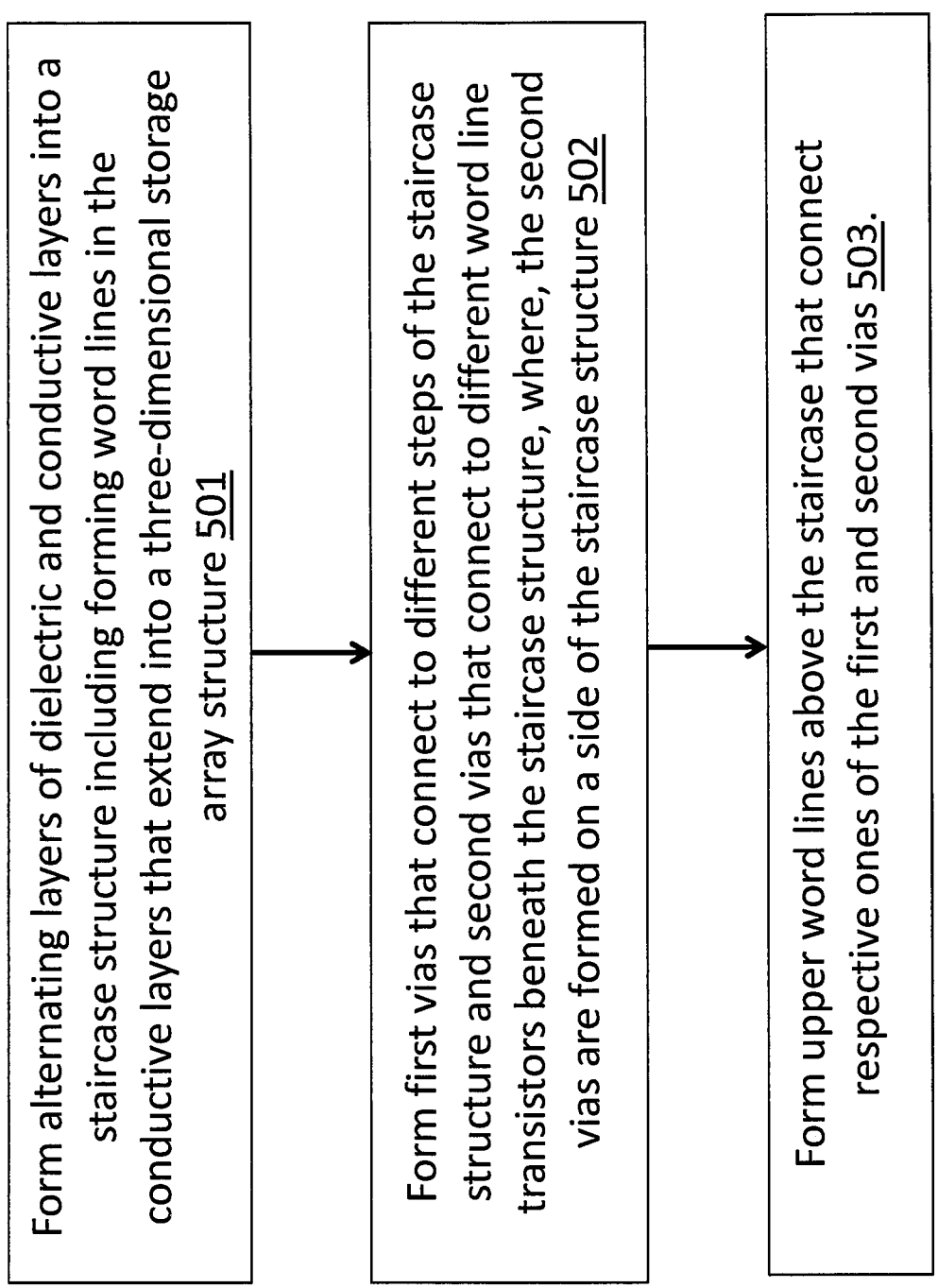
FIG. 5 shows a methodology of forming improved word line structures.

FIG. 5 shows a method of forming improved wire line structures. The method includes forming alternating layers of dielectric and conductive layers into a staircase structure including forming word lines in the conductive layers that extend into a three-dimensional storage array structure 501. The method also includes forming first vias that connect to different steps of the staircase structure and second vias that connect to different word line transistors beneath the staircase structure, where, the second vias are formed on a side of the staircase structure 502. The method also includes forming upper word lines above the staircase that connect respective ones of the first and second vias 503.

Although the above discussion was directed to a vertical NAND FLASH semiconductor memory, it is pertinent to point out that other three-dimensional storage technologies may benefit from the teachings provided above. For example, the teachings provided above may be applied to a three-dimensional storage technology (such as a three-dimensional crosspoint technology) including but not limited to of an emerging non volatile random access memory technology such as, to name a few possibilities, a phase change based memory, memory devices that use chalcogenide phase change material (e.g., glass), multi-threshold level NAND flash memory, NOR flash memory, a ferroelectric based memory (e.g., FRAM), a magnetic based memory (e.g., MRAM), a spin transfer torque based memory (e.g., STT-RAM), a resistor based memory (e.g., ReRAM), a Memristor based memory, universal memory, Ge2Sb2Te5 memory, programmable metallization cell memory, amorphous cell memory, Ovshinsky memory, etc.

Figure 6:
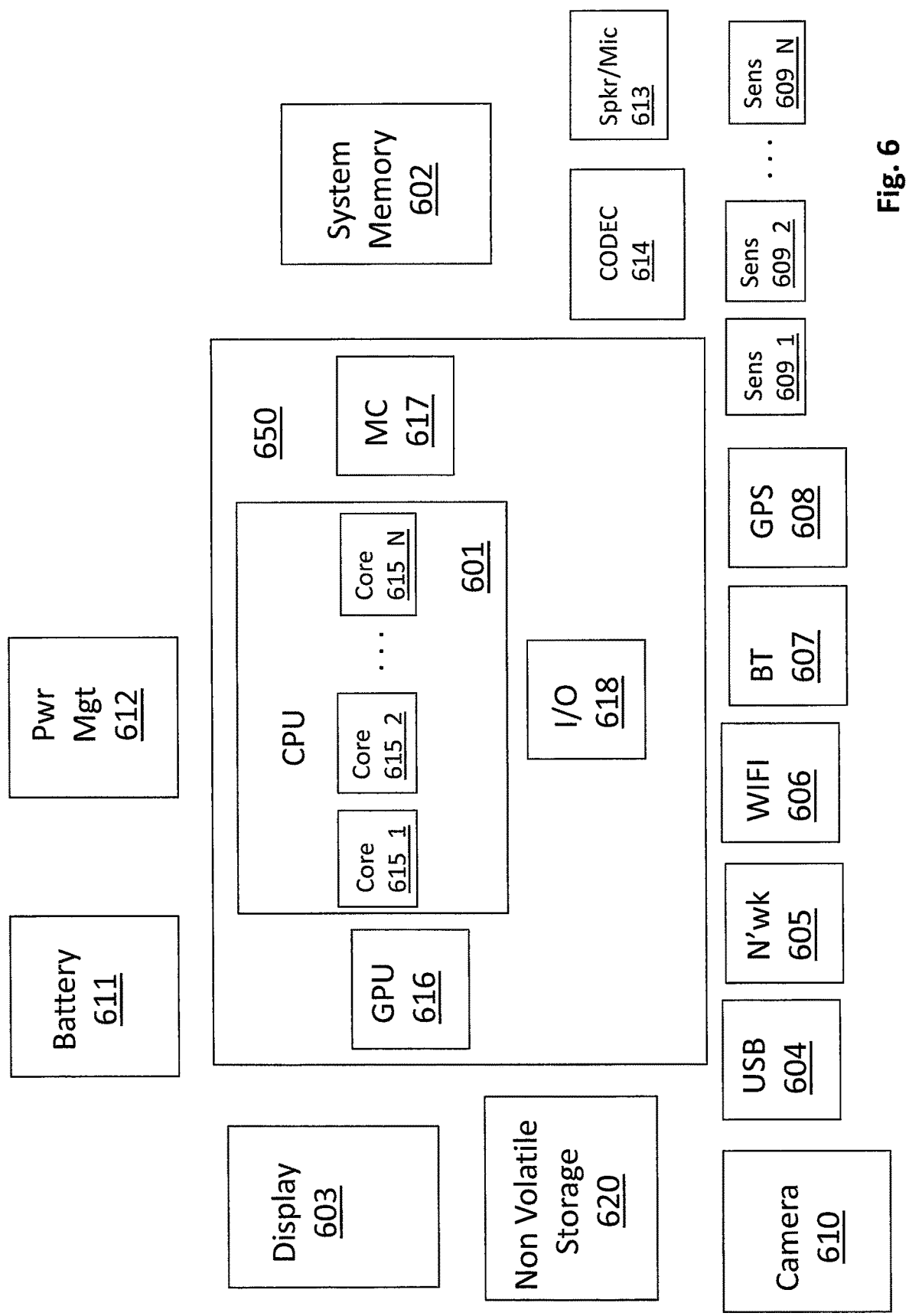
FIG. 6 shows a computing system.

FIG. 6 shows a depiction of an exemplary computing system 600 such as a personal computing system (e.g., desktop or laptop) or a mobile or handheld computing system such as a tablet device or smartphone, or, a larger computing system such as a server computing system. As observed in FIG. 6, the basic computing system may include a central processing unit 601 (which may include, e.g., a plurality of general purpose processing cores and a main memory controller disposed on an applications processor or multi-core processor), system memory 602, a display 603 (e.g., touchscreen, flat-panel), a local wired point-to-point link (e.g., USB) interface 604, various network I/O functions 605 (such as an Ethernet interface and/or cellular modem subsystem), a wireless local area network (e.g., WiFi) interface 606, a wireless point-to-point link (e.g., Bluetooth) interface 607 and a Global Positioning System interface 608, various sensors 609_1 through 609_N (e.g., one or more of a gyroscope, an accelerometer, a magnetometer, a temperature sensor, a pressure sensor, a humidity sensor, etc.), a camera 610, a battery 611, a power management control unit 612, a speaker and microphone 613 and an audio coder/decoder 614.

An applications processor or multi-core processor 650 may include one or more general purpose processing cores 615 within its CPU 601, one or more graphical processing units 616, a memory management function 617 (e.g., a memory controller) and an I/O control function 618. The general purpose processing cores 615 typically execute the operating system and application software of the computing system. The graphics processing units 616 typically execute graphics intensive functions to, e.g., generate graphics information that is presented on the display 603. The memory control function 617 interfaces with the system memory 602.

The system memory 602 may be a multi-level system memory having, e.g., a first level having faster access times than a second lower level. The second lower level may be implemented with a three-dimensional storage technology having the word line design approach discussed at length above. Alternatively or in combination, the three-dimensional storage technology having the word line approach described at length above may be implemented in a more traditional non volatile storage such as a solid state disk (SSD) replacement for a traditional hard disk drive and/or BIOS memory.

Each of the touchscreen display 603, the communication interfaces 604-607, the GPS interface 608, the sensors 609, the camera 610, and the speaker/microphone codec 613, 614 all can be viewed as various forms of I/O (input and/or output) relative to the overall computing system including, where appropriate, an integrated peripheral device as well (e.g., the camera 610). Depending on implementation, various ones of these I/O components may be integrated on the applications processor/multi-core processor 650 or may be located off the die or outside the package of the applications processor/multi-core processor 650.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. A method, comprising:
   forming alternating layers of dielectric and conductive layers into a staircase structure including forming word lines in conductive layers that extend into a three dimensional storage array structure;
   forming first vias that connect to different steps of the staircase structure and second vias that connect to different word line transistors beneath the staircase structure, the second vias formed on a side of the staircase structure other than the side of the staircase structure that is farthest from the three dimensional storage array structure; and,
   forming upper word lines above the staircase structure that connect respective ones of the first and second vias.

2. The method of claim 1 further comprising forming a second staircase structure that extends from the staircase structure in a direction away from the three dimensional storage array structure.

3. The method of claim 1 further comprising forming a second staircase structure that is part of a second staircase chain that is different than a first staircase chain that the staircase structure is a part of.

4. The method of claim 1 wherein the three dimensional storage array structure is comprised of non volatile memory cells.

5. The method of claim 4 wherein the three dimensional storage array structure is comprised of any of:
   FLASH random access memory (RAM) storage cells;
   phase change RAM storage cells;
   resistive RAM storage cells;
   ferro-electric RAM storage cells; magnetic RAM storage cells;
   spin transfer torque storage cells.

6. The method of claim 1 further comprises forming a landing adjacent to the staircase structure and forming the second vias directly off a side of the landing.

\* \* \* \* \*